(12) United States Patent
Wu et al.

(10) Patent No.: US 12,472,891 B2
(45) Date of Patent: Nov. 18, 2025

(54) VEHICLE CONTROL DEVICE AND VEHICLE EMPLOYING DEVICE

(71) Applicants: Futaijing Precision Electronics (Yantai) Co., Ltd., Yantai (CN); HON HAI PRECISION INDUSTRY CO., LTD., New Taipei (TW)

(72) Inventors: Chin-Ning Wu, New Taipei (TW); Tien-Chi Tsou, New Taipei (TW); Chih-Hsueh Lin, New Taipei (TW)

(73) Assignees: Futaijing Precision Electronics (Yantai) Co., Ltd., Yantai (CN); HON HAI PRECISION INDUSTRY CO., LTD., New Taipei (TW)

( * ) Notice: Subject to any disclaimer, the term of this patent is extended or adjusted under 35 U.S.C. 154(b) by 321 days.

(21) Appl. No.: 18/235,606

(22) Filed: Aug. 18, 2023

(65) Prior Publication Data

US 2024/0391402 A1    Nov. 28, 2024

(30) Foreign Application Priority Data

May 26, 2023   (CN) .......................... 202310619830.1

(51) Int. Cl.
*B60R 16/023*     (2006.01)
*H05K 5/00*       (2025.01)
*H05K 7/14*       (2006.01)

(52) U.S. Cl.
CPC ...... *B60R 16/0239* (2013.01); *B60R 16/0231* (2013.01); *H05K 5/0047* (2013.01); *H05K 7/1427* (2013.01)

(58) Field of Classification Search
CPC ............ B60R 16/0231; B60R 16/0239; H05K 5/0047; H05K 7/1427
See application file for complete search history.

(56) References Cited

U.S. PATENT DOCUMENTS

| | | | |
|---|---|---|---|
| 2012/0064741 A1* | 3/2012 | Kawaguchi .......... | H05K 5/0026 439/76.2 |
| 2012/0200988 A1* | 8/2012 | Uchida ................. | H05K 1/029 361/624 |
| 2013/0205560 A1* | 8/2013 | Ghannam ........... | B60R 16/0239 403/2 |
| 2016/0272132 A1* | 9/2016 | Hachiya ............... | H05K 3/4626 |
| 2018/0065576 A1* | 3/2018 | Kawaguchi ............ | H01R 9/226 |

(Continued)

*Primary Examiner* — Timothy J Thompson
*Assistant Examiner* — Rhadames Alonzo Miller
(74) *Attorney, Agent, or Firm* — ScienBiziP, P.C.

(57) ABSTRACT

A vehicle control device for shell sharing between control modules comprises a first control module and a second control module. The first control module comprises a plurality of first connectors, a first circuit board, and a first controller arranged in a second area of the first circuit board. The second control module comprises a plurality of second connectors, a second circuit board, and a second controller arranged in the fourth area of the second circuit board. By setting the size of the first circuit board and the second circuit board to be consistent, the number and type of the first connectors and the second connectors to be consistent, and the second area of the second circuit board corresponding to the first area of the first circuit board is set, the shell structure of the first control module and the second control module can be shared. A vehicle is also provided.

18 Claims, 9 Drawing Sheets

(56) References Cited

U.S. PATENT DOCUMENTS

2018/0326924 A1* 11/2018 Haraguchi ............... H02G 3/16
2020/0118778 A1*  4/2020 Oda ....................... H01H 45/14
2023/0007958 A1*  1/2023 Takamizawa ............ G01K 1/14
2024/0132003 A1*  4/2024 Selvaraj ............. H05K 7/20863

* cited by examiner

VEHICLE CONTROL DEVICE AND VEHICLE EMPLOYING DEVICE

TECHNICAL FIELD

The subject matter herein generally relates to vehicles.

BACKGROUND

With the improving of advanced driving assistance, the electrification degree of vehicle control, diversifying experience of the cockpit, remote control, and real-time communication, the electric control system in the vehicle is increasingly complex, and the number of various control devices and functional circuits is increasing. The shell of the vehicle control device needs to be re-design according to different functional requirements, which requires a lot of manpower, material resources and time costs.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 1:
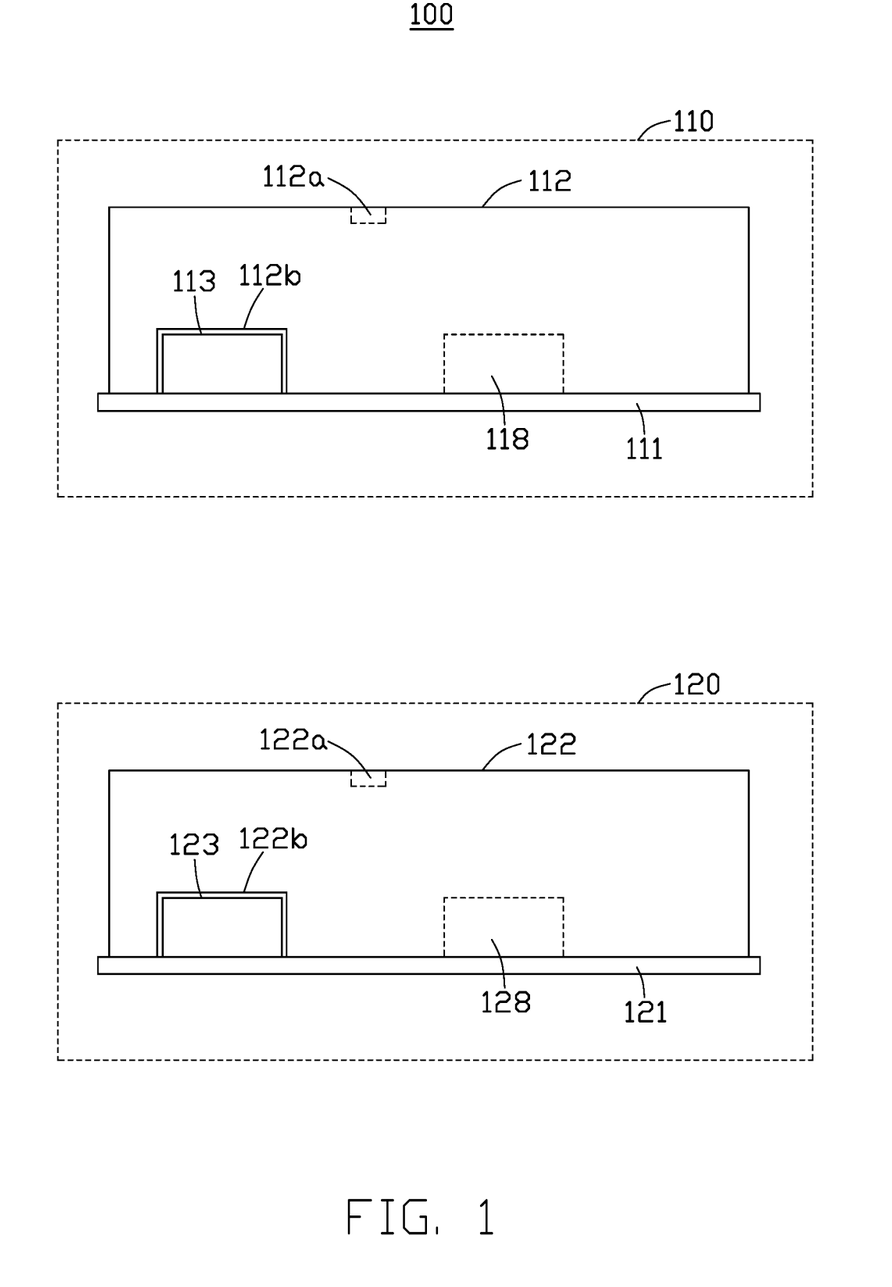
FIG. 1 is a plane structure diagram of a vehicle control device in one embodiment of the present application.

FIG. 1 is a plane structure diagram of a vehicle control device 100 in one embodiment of the present application. The vehicle control device 100 comprises a first control module 110 and a second control module 120. The first control module 110 comprises a first controller 118, a first circuit board 111, a first shell 112, and a plurality of first connectors 113. The plurality of the first connectors 113 is arranged on a first area of the first circuit board 111. The first area is close to an outer edge of the first circuit board 111. The first controller 118 is arranged in a second area of the first circuit board 111. The first circuit board 111 and the first shell 112 are enclosed to form a first cavity. The plurality of the first connectors 113 and the first controller 118 are arranged in the first cavity. The first shell comprises a plurality of first through holes 112b, positions of the plurality of first through holes 112b correspond to positions of the plurality of first connectors 113 one by one. The plurality of first connectors 113 is configured to transmit first data signals and/or first power signals.

The second control module 120 comprises a second controller 128, a second circuit board 121, a second shell 122, and a plurality of second connectors 123. The plurality of the second connectors 123 is arranged on a third area of the second circuit board 121. The third area is close to an outer edge of the first circuit board 121. The second controller 128 is arranged in the fourth area of the second circuit board 121. The second circuit board 121 and the second shell 122 are enclosed to form a second cavity. The plurality of the second connectors 123 and the second controller 128 are arranged in the second cavity. The second shell 122 comprises a plurality of second through holes 122b, positions of the plurality of second through holes 122b correspond to positions of the plurality of second connectors one by one. The plurality of second connectors 123 is configured to transmit second data signals and/or second power signals.

A size of the second circuit board 121 is consistent with a size of the first circuit board 111. A position of the third area in the second circuit board 121 corresponds to a position of the first area in the first circuit board 111. A position of the fourth area in the second circuit board 121 corresponds to a position of the second area in the first circuit board 111. Types of the plurality of second connectors 123 are consistent with types of the plurality of first connectors 113. A number of the plurality of second connectors 123 is consistent with a number of the plurality of first connectors 113, and a shape structure of the second shell 122 is consistent with a shape structure of the first shell 112.

In this embodiment, the first controller 118 can be configured to control body of vehicle and the second controller 128 can be configured to process vehicle data. The first data signals can comprise control signals, drive signals, etc. The first connectors 113 can be connected with the body execution system and a multimedia panel to realize the communication among the first controller 118, the body execution system, the multimedia panel, and other external devices, and transmit the control signals and the drive signals to the body execution system, multimedia panel, and other external devices to control the corresponding external devices. The second data signal can comprise various sampling signals, control signals, etc. The second connectors 123 can be connected with various sensors, Electronic Control Unit (ECU), etc., to realize the communication among the second controller 128, various sensors, ECU, and other external devices. The second connectors 123 can transmit the sampling signals output by of the various sensors to the second controller 128. Then the sampling signals are transmitted from the second controller 128 to the ECU for calculation processing, and the corresponding control signal is output according to the calculation result to adjust the running state of the vehicle 1. The plurality of first connectors 113 comprises at least one type of power connectors, optical fiber connectors, and Ethernet connectors. The plurality of second connectors 123 comprises at least one type of power connectors, optical fiber connectors, and Ethernet connectors. The number of the first connectors 113 and the second connectors 123 can be set according to the actual requirements, for example, it can be set to the maximum required to meet all the functions that can be achieved by the vehicle control device 100. In this way, when the vehicle control device 100 is applied to different projects, it is only necessary to connect the required connectors with the corresponding functional circuit, without changing the layout of the connectors and the shape of the shell.

In addition, the third area of the second circuit board 121 corresponds to the first area of the first circuit board 111, such that the positions of the first connectors 113 in the first shell 112 and the positions of the second connectors 123 in the second shell 122 are also consistent. And the size of the first circuit board 111 and the size of the second circuit board 121 are consistent, as well as the numbers and the types of the first connecting device 113 and the second connecting device 123 are consistent, so that the positions and sizes of the first through holes 112b in the first shell 112 and the second through holes 122b in the second shell 122 are also consistent. Thus, the shapes and structures of the first shell 112 and the second shell 122 are consistent, realizing shell structure sharing of the first control module 110 and the second control module 120. In this way, the first shell 112 and the second shell 122 can use the same mold opening method and mold opening equipment for mold opening and producing, reducing the time and labor consumption in the development and production process, improving production efficiency and reducing production costs.

The position of the fourth area in the second circuit board 121 corresponds to the second area of the first circuit board 111, so that the position of the second controller 128 in the first circuit board 111 can correspond to the first controller 118 in the second circuit board 121. In this way, the outgoing pins of the first controller 118 and the second controller 128 can be the same, and the first connectors 113 and the second connectors 123 are arranged in the same position, so that the circuit design of the first circuit board 111 and the second circuit board 121 can also be shared. In other words, the first circuit board 111 and the second circuit board 121 can use the circuit boards with the same circuit layout. Furthermore, the first controller 118 and the second controller 128 can use the same type of control chip or the same manufacturer's control chip to achieve the same or basically the same circuit design. When the vehicle control device 100 is applied to different projects, the chip pins that need to be used can be directly connected to the corresponding connector or circuit, without redesigning the circuit. Among them, the first controller 118 and the second controller 128 can be realized by using the same type of microprocessor, field-programmable gate array and other chips.

By setting the sizes of the first circuit board 111 and the second circuit board 121 to be consistent, the number and type of the first connector 113 and the second connector 123 can be consistent, the second area of the second circuit board 121 corresponds to the first area of the first circuit board 111, the shapes and structures of the first shell 112 and the second shell 122 can be consistent, and the first control module 110 and the second control module 120 can share the same shell structure, reducing the time and manpower consumption in the development and production process, improving production efficiency and reducing production costs.

Figure 3:
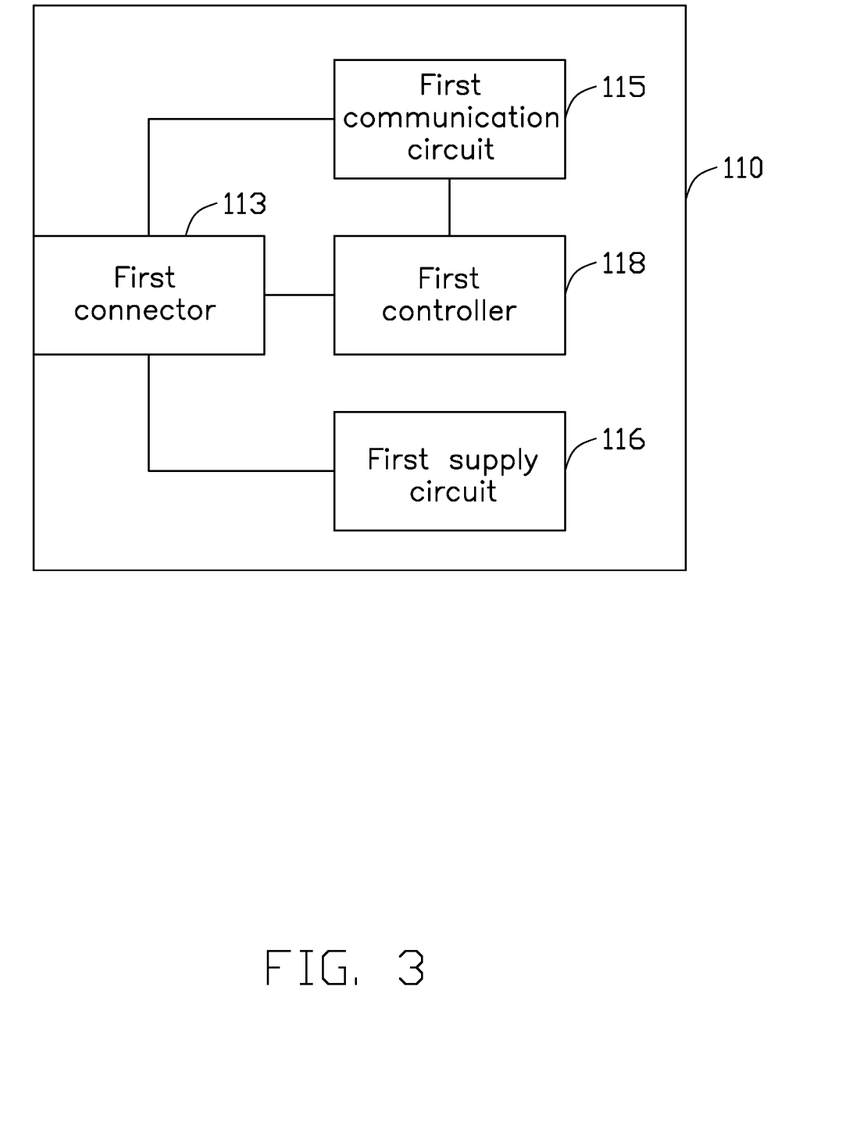
FIG. 3 is a structural diagram of the first control module according to an embodiment of the present disclosure.
Figure 4:
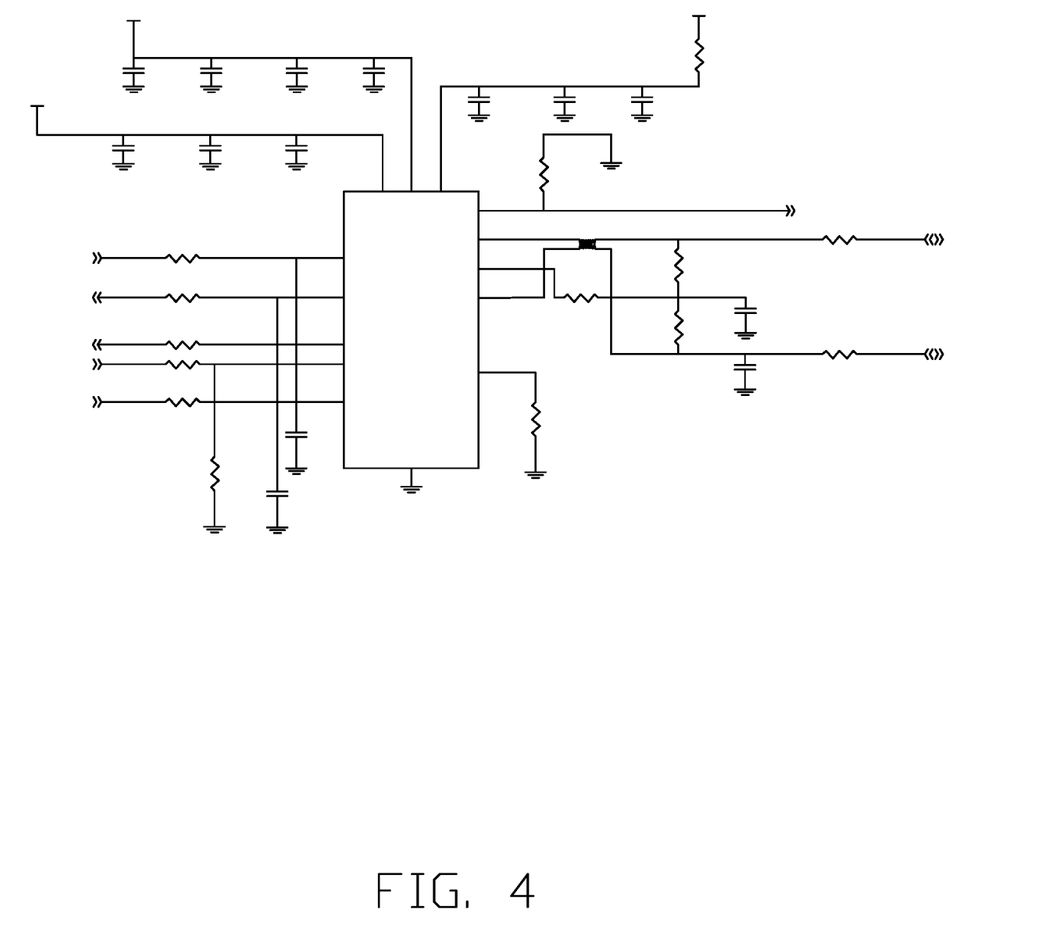
FIG. 4 is a structural diagram of a first communication circuit according to an embodiment of the present disclosure.

Referring to FIGS. 3 and 4, the first control module 110 may further comprise a first communication circuit 115 arranged in a fifth area of the first circuit board 111 and a first supply circuit 116 arranged in a sixth area of the first circuit board 111. The first communication circuit 115 is configured to transmit first data signals. The first supply circuit 116 is configured to convert a supply voltage to first power signals with a first voltage.

In this embodiment, the first communication circuit 115 can be a Controller Area Network (CAN) communication circuit, ETH (ethernet) communication circuit, etc. The number of first communication circuits 115 can be multiple. The first communication circuit 115 can comprise a communication chip. The first power circuit 116 can comprise a Metal Oxide Semiconductor and/or a buck chip.

Figure 5:
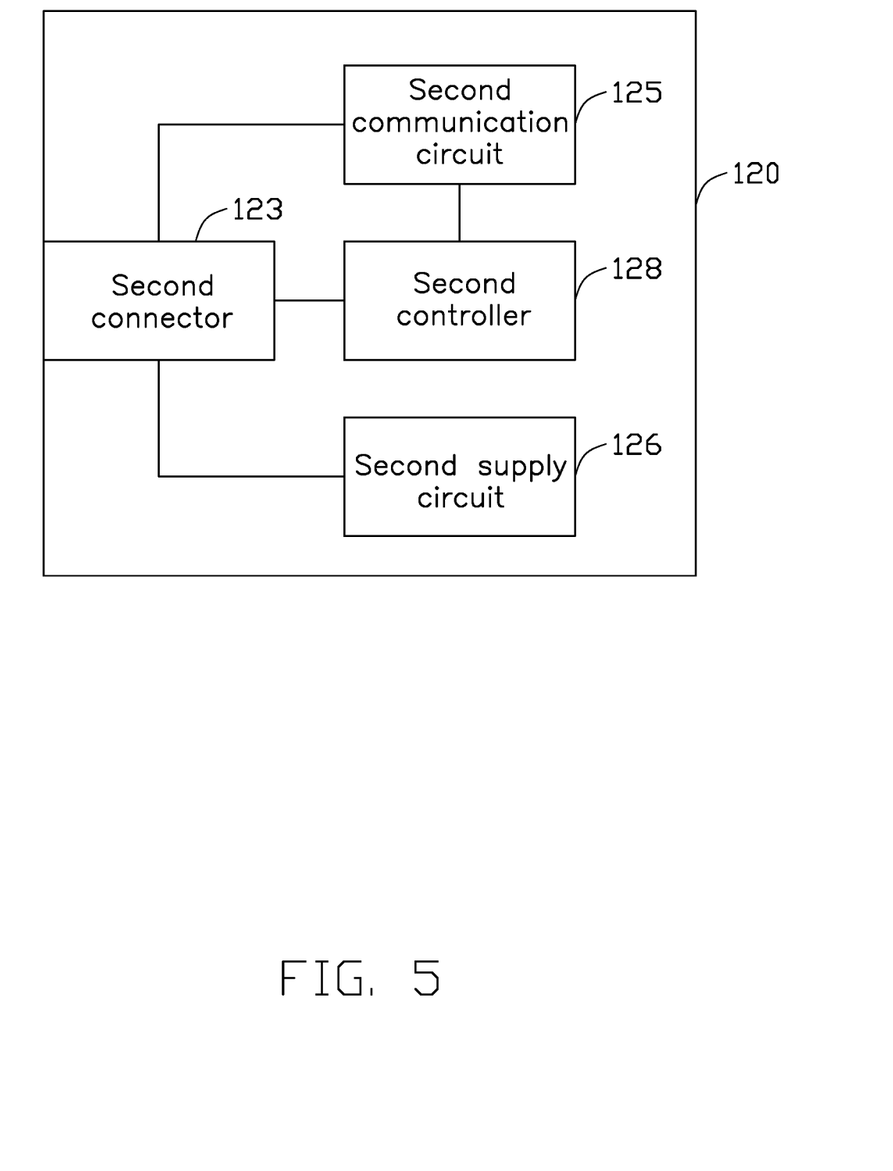
FIG. 5 is a structural diagram of a second control module according to an embodiment of the present disclosure.

FIG. 5 is a structural diagram of the second control module 120 according to an embodiment of the present disclosure.

In one embodiment, the second control module 120 further comprises a second communication circuit 125 arranged in a seventh area of the second circuit board and a second supply circuit 126 arranged in an eighth area of the second circuit board 121. The second communication circuit 125 is configured to transmit second data signals. The second supply circuit 126 is configured to convert a supply voltage to second power signals with a second voltage. A position of the seventh area in the second circuit board 121 corresponding to a position of the fifth area in the first circuit board 111. A position of the eighth area of the second circuit board 121 corresponding to a position of the sixth area of the first circuit board 111.

In this embodiment, the second communication circuit 125 can be a Controller Area Network (CAN) communication circuit, ETH (ethernet) communication circuit, etc. The number of second communication circuits 125 can be multiple. The second communication circuit 125 can comprise a communication chip. The second power circuit 126 can comprise a Metal Oxide Semiconductor and/or a buck chip.

By setting the position of the seventh area in the second circuit board 121 corresponding to the position of the fifth area of the first circuit board 111, and the position of the eighth area of the second circuit board 121 corresponding to the position of the sixth area of the first circuit board 111, the position of the second communication circuit 125 in the second circuit board 121 and the first communication circuit 115 in the first circuit board 111 can be consistent, and the position of the second power circuit 126 in the second circuit board 121 and the first power circuit 116 in the first circuit board 121 can be consistent. Thus the circuit design of the first circuit board 111 and the second circuit board 121 can be shared. In other words, the first circuit board 111 and the second circuit board 121 can use the circuit boards with the same circuit layout. Furthermore, the first communication circuit 115 and the second communication circuit 125 can comprise the same type of communication chip to achieve the same circuit layout design. When applied to different projects, the chip pins can be directly connected to the corresponding connector or circuit according to an actual requirement, without redesigning the circuit.

Figure 6:
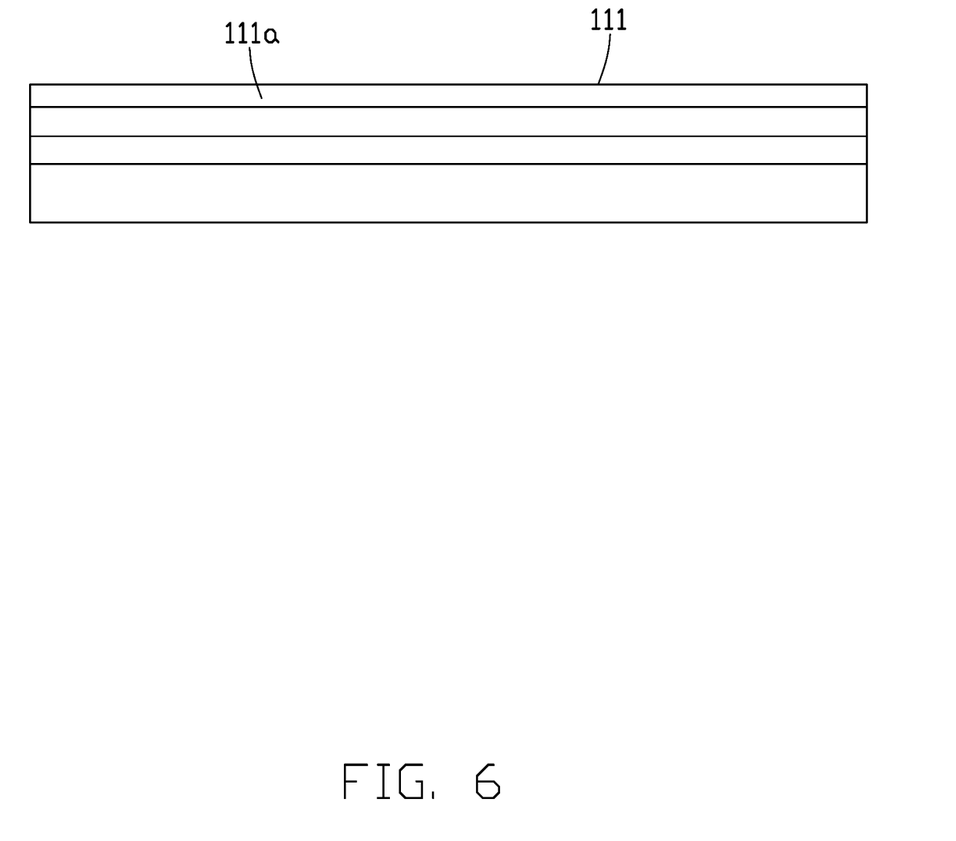
FIG. 6 is a structural diagram of a first circuit board according to an embodiment of the present disclosure.

FIG. 6 is a structural diagram of the first circuit board 111 according to an embodiment of the present disclosure.

In one embodiment, the first circuit board 111 comprises a plurality of first wiring layers 111*a*, and a number of the first wiring layers 111*a* is positively correlated with a number of the total outgoing pins of the first communication circuit 115 and the first supply circuit 116.

For example, the total number of outgoing pins of the first communication circuit 115 and the first power circuit 116 can be 20 pins, and the number of the first wiring layer 111*a* can be set to 10 layers; the total number of outgoing pins of the first communication circuit 115 and the first power circuit 116 can be 25 pins, and the number of the first wiring layer 111*a* can be set to 12 layers; the total number of outgoing pins of the first communication circuit 115 and the first power circuit 116 can be 30 pins, and the number of the first wiring layer 111*a* can be set to 14 layers. In this way, the design of outgoing lines of multiple outgoing pins can be convenient, and avoiding that outgoing pins of the first communication circuit 115 and the first power circuit 116 occur conflicting.

Figure 7:
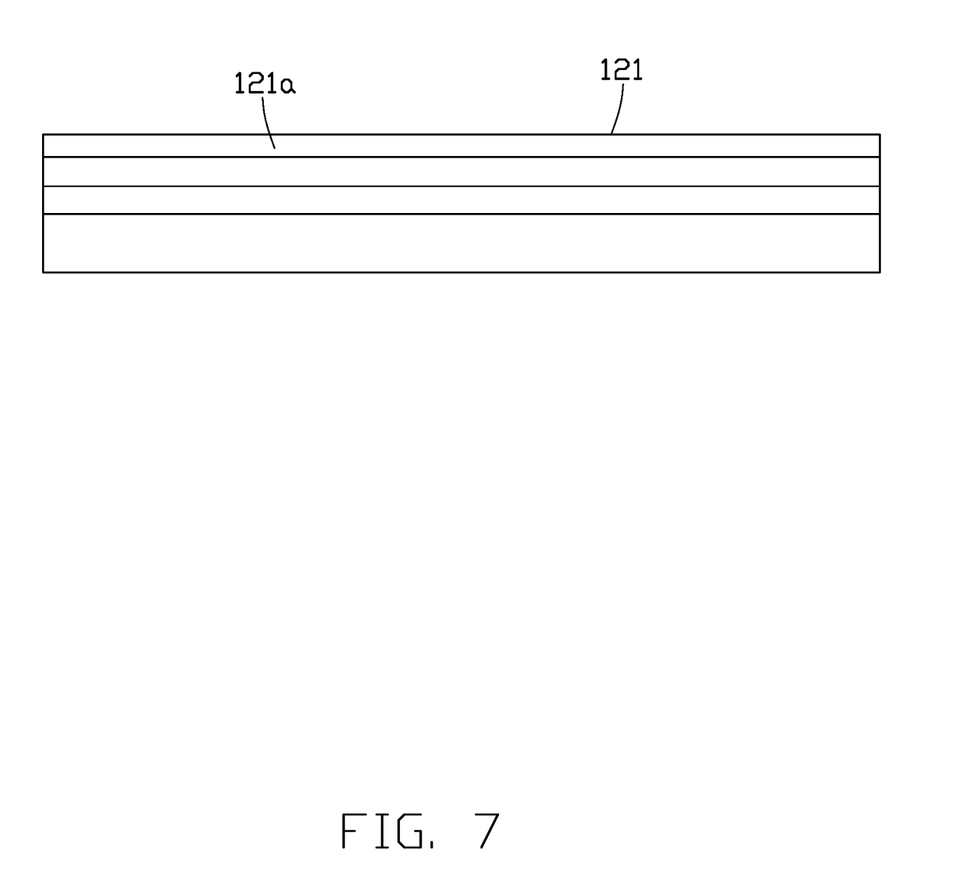
FIG. 7 is a structural diagram of a second controller according to an embodiment of the present disclosure.

FIG. 7 is a structural diagram of a second controller 128 according to an embodiment of the present disclosure.

In one embodiment, the second circuit board 121 comprises a plurality of second wiring layers 121*a*, and a number of the second wiring layers 121*a* is positively correlated with a number of the total outgoing pins of the second communication circuit 125 and the second supply circuit 126.

For example, the total number of outgoing pins of the second communication circuit 125 and the second power circuit 126 is 20 pins, and the number of the second wiring layer 121*a* can be set to 10 layers; the total number of outgoing pins of the second communication circuit 125 and the second power circuit 126 is 25 pins, and the number of the second wiring layer 121*a* can be set to 12 layers; the total number of outgoing pins of the second communication circuit 125 and the second power circuit 126 is 30 pins, and the number of the second wiring layer 121*a* can be set to 14 layers. In this way, the design of outgoing lines of multiple outgoing pins can be convenient, and avoiding that outgoing pins of the second communication circuit 125 and the second power circuit 126 occur conflicting.

Figure 2:
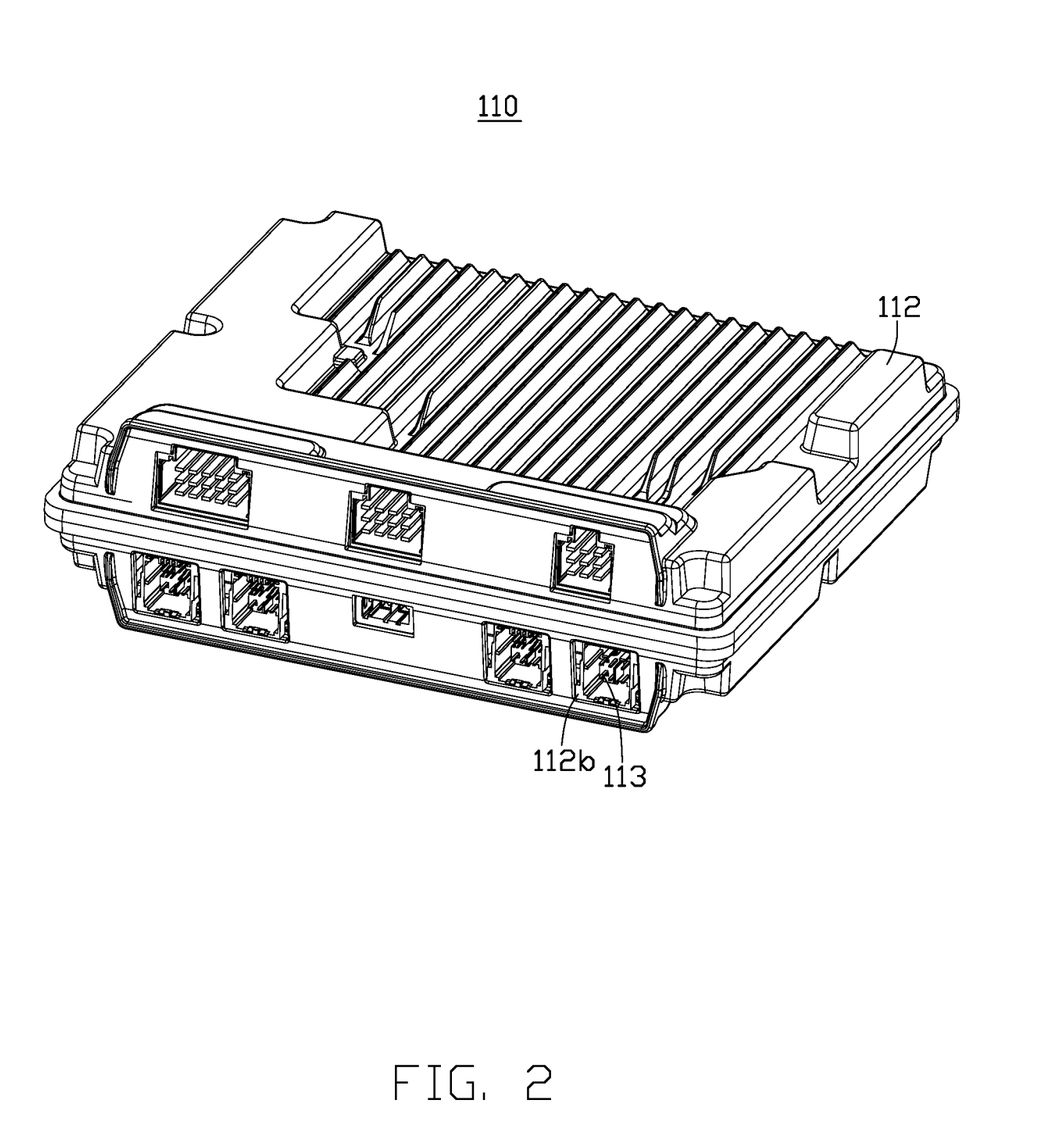
FIG. 2 is a stereochemical structure diagram of a first control module according to an embodiment of the present disclosure.

In one embodiment, the first shell 112 can comprise a plurality of first heat dissipation components 112*a*. The positions of the plurality of first heat dissipation components 112*a* respectively corresponds to the second area, the fifth area, and the sixth area to cool the first controller 118, the first communication circuit 115, and the first power supply circuit 116. Among them, the plurality of first heat dissipation components 112*a* can be a fin radiator to increase the heat dissipation area and improve the heat dissipation efficiency. Alternatively, the plurality of first heat dissipation components 112*a* can be arranged in a convex shape toward the first circuit board 111, increasing the heat dissipation area and bringing the plurality of first heat dissipation components 112*a* closer to the first controller 118, the first communication circuit 115, and the first power circuit 116 to conduct heat in time. Furthermore, the first shell 112 and the second shell 122 can be metal materials, and the metal materials conduct heat quickly, which is conducive to improving the heat dissipation efficiency.

In one embodiment, the distance between the second area, fifth area, and sixth area can be less than a first preset distance. The first preset distance can be set according to the actual circuit requirements, and the distance between the first communication circuit 115 and the first power circuit 116 can be reduced while meeting the circuit layout design. Thus, the first communication circuit 115 and the first power circuit 116 can be cooled simultaneously with only one first heat dissipation component 112*a*.

In one embodiment, the second shell 122 can comprise a plurality of second heat dissipation components 122*a*. The positions of the plurality of second heat dissipation components respectively corresponds to the fourth area, the seventh area, and the eighth area to cool the second controller 128, the second communication circuit 125, and the second power supply circuit 126. Among them, the plurality of second heat dissipation components 122*a* can be a fin radiator to increase the heat dissipation area and improve the heat dissipation efficiency. Alternatively, the plurality of second heat dissipation components 122*a* can be arranged in a convex shape toward the second circuit board 121, increasing the heat dissipation area and bringing the plurality of second heat dissipation components 122*a* closer to the second controller 128, the second communication circuit 125, and the second power circuit 126 to conduct heat in time.

In one embodiment, the distance between the fourth area, the seventh area, and the eighth area can be less than a second preset distance. The second preset distance can be set according to the actual circuit requirements, and the distance between the second communication circuit 125 and the second power circuit 126 can be reduced while meeting the circuit layout design. Thus, the second communication circuit 125 and the second power circuit 126 can be cooled simultaneously with only one second heat dissipation component 122*a*.

Figure 8:
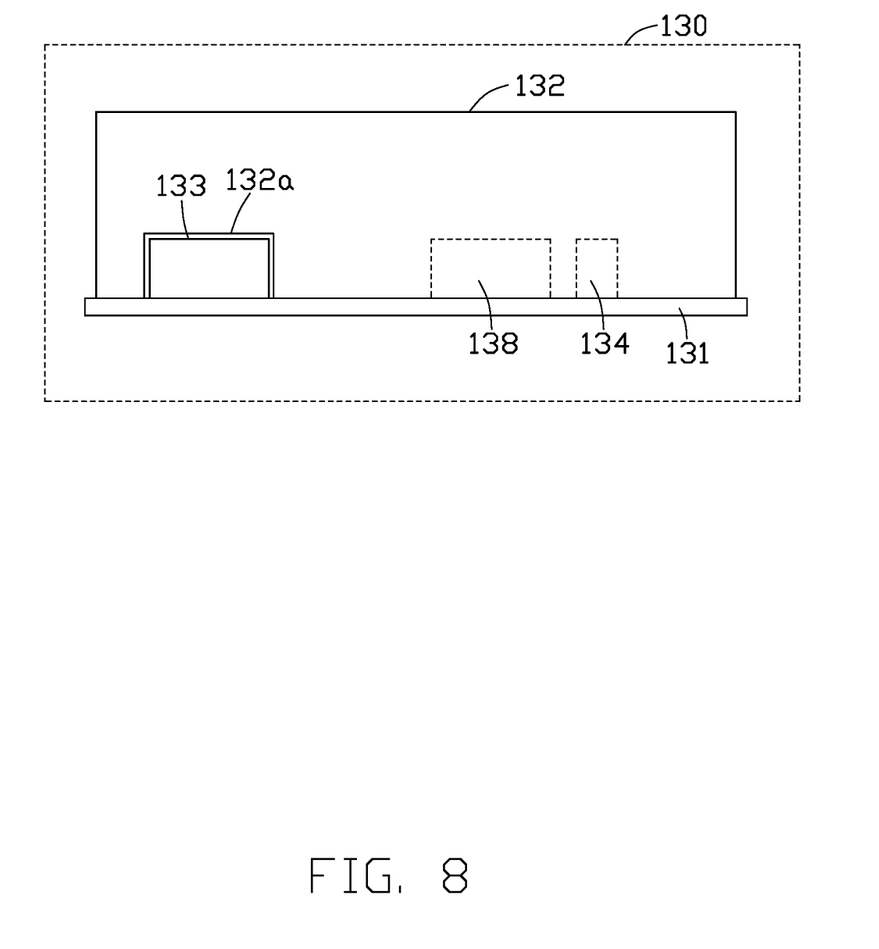
FIG. 8 is a structural diagram of a third control module according to an embodiment of the present disclosure.

FIG. 8 is a structural diagram of a third control module 130 according to an embodiment of the present disclosure.

In one embodiment, the vehicle control device 100 may further comprise a third control module 130. The third control module 130 comprises a third controller 138, a third circuit board 131, a third shell 132, a plurality of third connectors 133, and at least one fourth connectors 134, and the plurality of the third connectors 133 is arranged on a ninth area of the third circuit board 131. The ninth area is close to an outer edge of the third circuit board 131. The third controller 138 is arranged in a tenth area of the third circuit board 131. The third circuit board and the third shell are enclosed to form a third cavity. The plurality of the third connectors 133 and the third controller 138 are arranged in the third cavity. The third shell 132 comprises a plurality of third through holes 132*a*, positions of the plurality of third through holes 132*a* corresponding to positions of the plurality of third connectors one by one. The plurality of third connectors is configured to transmit first data signals and/or first power signals. The fourth connector 134 is arranged on the eleventh area of the third circuit board 131, and the eleventh area is close to the outer edge of the third circuit board 131. The eleventh area is adjacent to the tenth area, the fourth connector is configured to transmit fourth data signals and/or fourth power signals.

A size of the third circuit board 131 is consistent with a size of the first circuit board 111. A position of the ninth area of the second circuit board 121 corresponds to a position of the first area in the first circuit board 111. A position of the tenth area of the third circuit board 131 corresponds to a position of the second area in the first circuit board 111. Types of the plurality of third connectors 133 are consistent with types of the plurality of first connectors 113. A number of the plurality of third connectors 133 is consistent with a number of the plurality of first connectors 113, and a shape structure of the third shell 132 is consistent with the shape structure of the first shell 112.

In this embodiment, the third controller 138 can be configured for body control, processing vehicle data, and image processing. The third data signals can comprise a control signal, a drive signal, a variety of sampling signals, etc. The third connector 133 can be connected with the body execution system, multimedia panel, various sensors, and other devices to realize the communication between the third controller 138 and the body execution system, multimedia panel, various sensors, and other devices. The control signal and the drive signal are transmitted to the body execution system, multimedia panel and other external devices, or the sample signal output by various sensors is transmitted to the ECU for calculation and processing, and the corresponding control signal is output according to the calculation results to adjust the running state of the vehicle. The fourth data signals can be an audio and video signal, and the fourth connector 134 can be connected to the camera device, microphone, and other devices to realize the communication between the third controller 138 and the camera device, microphone, and other devices, so that the third controller 138 can process the video signal and audio signal collected by the camera device and microphone.

In one embodiment, the plurality of the third connectors 133 comprises at least one type of power connectors, optical fiber connectors, and Ethernet connectors, the fourth connector 134 can be an audio connector and/or a video connector.

The number of the third connectors 133 and the fourth connectors 134 can be set according to the actual demands, for example, it can be set to the maximum required to meet all the functions that can be achieved by the vehicle control device 100. In this way, when applied to different projects, it is only necessary to connect the required connectors with the corresponding functional circuit, without changing the layout of the connectors and the shape of the shell.

Furthermore, the position of the ninth area of the third circuit board 131 corresponding to the position of the first area of the first circuit board 111 such that the position of the plurality of the third connectors 133 in the third shell 132 and the position of the plurality of the first connectors 113 in the first shell 112 can be consistent. Except for the through hole corresponding to the fourth connector, which needs to be opened separately, the rest of the shape structure of the third shell 132 can be shared with the first housing 112. For example, the third shell 132 can be further machined on the basis of the first shell 112 to open a through hole corresponding to the fourth connector for image processing. In this way, the first shell 112 and the third shell 132 can also use the same mold opening method and mold opening equipment for mold opening and producing, reducing the time and labor consumption in the development and production process, improving production efficiency and reducing production costs.

Figure 9:
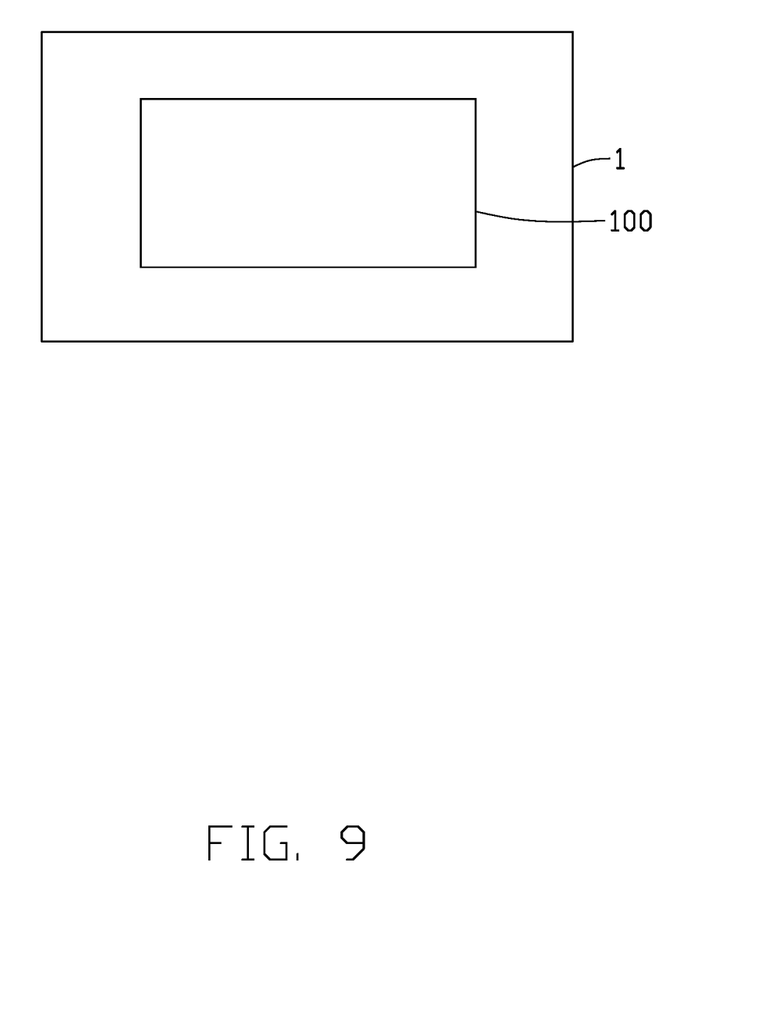
FIG. 9 is a structural diagram of a vehicle according to an embodiment of the present disclosure.

FIG. 9 is a structural diagram of a vehicle 1 according to an embodiment of the present disclosure.

The vehicle 1 comprises a vehicle control device 100. The detailed structure of the vehicle control device 100 can be referred to the above embodiments. It can be understood that the vehicle control device 100 can be used in the vehicle 1, the embodiment of the vehicle 1 comprises all the technical schemes of all the embodiments of the vehicle control device 100, and the technical effects achieved are exactly the same, and will not be repeated here.

The exemplary embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A vehicle control device, comprising:
   a first control module, wherein the first control module comprises a first controller, a first circuit board, a first shell, and a plurality of first connectors, the plurality of the first connectors are arranged on a first area of the first circuit board, the first area is closed to an outer edge of the first circuit board, the first controller is arranged in a second area of the first circuit board, the first circuit board and the first shell are enclosed to form a first cavity, the plurality of the first connectors and the first controller are arranged in the first cavity, the first shell comprises a plurality of first through holes, positions of the plurality of first through holes correspond to positions of the plurality of first connectors one by one, the plurality of first connectors are configured to transmit first data signals and/or first power signals;
   a second control module, wherein the second control module comprises a second controller, a second circuit board, a second shell, and a plurality of second connectors, the plurality of the second connectors are arranged on a third area of the second circuit board, the third area is close to the outer edge of the first circuit board, the second controller is arranged in a fourth area of the second circuit board, the second circuit board and the second shell are enclosed to form a second cavity, the plurality of the second connectors and the second controller are arranged in the second cavity, the second shell comprises a plurality of second through holes, positions of the plurality of second through holes correspond to positions of the plurality of second connectors one by one, the plurality of second connectors are configured to transmit second data signals and/or second power signals,
   wherein a size of the second circuit board is consistent with a size of the first circuit board, a position of the third area in the second circuit board corresponds to a position of the first area in the first circuit board, a position of the fourth area in the second circuit board corresponds to a position of the second area in the first circuit board, types of the plurality of second connectors are consistent with types of the plurality of first connectors, a number of the plurality of second connectors is consistent with a number of the plurality of first connectors, and a shape structure of the second shell is consistent with a shape structure of the first shell.

2. The vehicle control device of claim 1, wherein the first control module further comprises a first communication circuit arranged in a fifth area of the first circuit board and a first supply circuit arranged in a sixth area of the first circuit board, the first communication circuit is configured to transmit first data signals, the first supply circuit is configured to convert a supply voltage to the first power signals with a first voltage.

3. The vehicle control device of claim 2, wherein the plurality of the first connectors comprises at least one type of power connectors, optical fiber connectors, and Ethernet connectors.

4. The vehicle control device of claim 2, wherein the first circuit board comprises a plurality of first wiring layers, and a number of the first wiring layers is positively correlated with a number of total outgoing pins of the first communication circuit and the first supply circuit.

5. The vehicle control device of claim 2, wherein the second control module further comprises a second communication circuit arranged in a seventh area of the second circuit board and a second supply circuit arranged in an eighth area of the second circuit board, the second communication circuit is configured to transmit the second data signals, the second supply circuit is configured to convert the supply voltage to the second power signals with a second voltage, a position of the seventh area in the second circuit board corresponds to a position of the fifth area in the first circuit board, a position of the eighth area of the second circuit board corresponds to a position of the sixth area of the first circuit board.

6. The vehicle control device of claim 1, wherein the plurality of the second connectors comprises at least one type of power connectors, optical fiber connectors, and Ethernet connectors.

7. The vehicle control device of claim 1, wherein the second circuit board comprises a plurality of second wiring layers, and a number of the second wiring layers is positively correlated with a number of total outgoing pins of the second communication circuit and the second supply circuit.

8. The vehicle control device of claim 1, further comprising a third control module, wherein the third control module comprises a third controller, a third circuit board, a third shell, a plurality of third connectors, and at least one fourth connector, the plurality of the third connectors is arranged on a ninth area of the third circuit board, the ninth area is close to an outer edge of the third circuit board, the third controller is arranged in a tenth area of the third circuit board, the third circuit board and the third shell are enclosed to form a third cavity, the plurality of the third connectors and the third controller are arranged in the third cavity, the third shell comprises a plurality of third through holes, positions of the plurality of third through holes correspond to positions of the plurality of third connectors one by one, the plurality of third connectors are configured to transmit third data signals and/or third power signals; the fourth connector is arranged on an eleventh area of the third circuit board, and the eleventh area is close to the outer edge of the third circuit board, and the eleventh area is adjacent to the tenth area; the fourth connector is configured to transmit fourth data signals and/or fourth power signals;

wherein a size of the third circuit board is consistent with the size of the first circuit board, a position of the ninth area of the second circuit board corresponds to the position of the first area in the first circuit board, a position of the tenth area of the third circuit board corresponds to the position of the second area in the first circuit board, types of the plurality of third connectors are consistent with the types of the plurality of first connectors, a number of the plurality of third connectors is consistent with the number of the plurality of first connectors, and a shape structure of the third shell is consistent with the shape structure of the first shell.

9. The vehicle control device of claim 8, wherein the plurality of the third connectors comprises at least one type of power connectors, optical fiber connectors, and Ethernet connectors, the fourth connector comprises an audio connector and/or a video connector.

10. A vehicle comprising a vehicle control device, the vehicle control device comprising:

a first control module, wherein the first control module comprises a first controller, a first circuit board, a first shell, and a plurality of first connectors, the plurality of the first connectors are arranged on a first area of the first circuit board, the first area is closed to an outer edge of the first circuit board, the first controller is arranged in a second area of the first circuit board, the first circuit board and the first shell are enclosed to form a first cavity, the plurality of the first connectors and the first controller are arranged in the first cavity, the first shell comprises a plurality of first through holes, positions of the plurality of first through holes correspond to positions of the plurality of first connectors one by one, the plurality of first connectors are configured to transmit first data signals and/or first power signals;

a second control module, wherein the second control module comprises a second controller, a second circuit board, a second shell, and a plurality of second connectors, the plurality of the second connectors are arranged on a third area of the second circuit board, the third area is close to the outer edge of the first circuit board, the second controller is arranged in a fourth area of the second circuit board, the second circuit board and the second shell are enclosed to form a second cavity, the plurality of the second connectors and the second controller are arranged in the second cavity, the second shell comprises a plurality of second through holes, positions of the plurality of second through holes correspond to positions of the plurality of second connectors one by one, the plurality of second connectors are configured to transmit second data signals and/or second power signals, wherein a size of the second circuit board is consistent with a size of the first circuit board, a position of the third area in the second circuit board corresponds to a position of the first area in the first circuit board, a position of the fourth area in the second circuit board corresponds to a position of the second area in the first circuit board, types of the plurality of second connectors are consistent with types of the plurality of first connectors, a number of the plurality of second connectors is consistent with a number of the plurality of first connectors, and a shape structure of the second shell is consistent with a shape structure of the first shell.

11. The vehicle of claim 10, wherein the first control module further comprises a first communication circuit arranged in a fifth area of the first circuit board and a first supply circuit arranged in a sixth area of the first circuit board, the first communication circuit is configured to transmit first data signals, the first supply circuit is configured to convert a supply voltage to the first power signals with a first voltage.

12. The vehicle of claim 11, wherein the plurality of the first connectors comprises at least one type of power connectors, optical fiber connectors, and Ethernet connectors.

13. The vehicle of claim 11, wherein the first circuit board comprises a plurality of first wiring layers, and a number of the first wiring layers is positively correlated with a number of total outgoing pins of the first communication circuit and the first supply circuit.

14. The vehicle of claim 11, wherein the second control module further comprises a second communication circuit arranged in a seventh area of the second circuit board and a second supply circuit arranged in an eighth area of the second circuit board, the second communication circuit is configured to transmit the second data signals, the second supply circuit is configured to convert the supply voltage to the second power signals with a second voltage, a position of the seventh area in the second circuit board corresponds to a position of the fifth area in the first circuit board, a position of the eighth area of the second circuit board corresponds to a position of the sixth area of the first circuit board.

15. The vehicle of claim 10, wherein the plurality of the second connectors comprises at least one type of power connectors, optical fiber connectors, and Ethernet connectors.

16. The vehicle of claim 10, wherein the second circuit board comprises a plurality of second wiring layers, and a number of the second wiring layers is positively correlated with a number of total outgoing pins of the second communication circuit and the second supply circuit.

17. The vehicle of claim 10, wherein the vehicle control device further comprises a third control module, the third control module comprises a third controller, a third circuit board, a third shell, a plurality of third connectors, and at least one fourth connector, the plurality of the third connectors are arranged on a ninth area of the third circuit board, the ninth area is closed to an outer edge of the third circuit board, the third controller is arranged in a tenth area of the third circuit board, the third circuit board and the third shell are enclosed to form a third cavity, the plurality of the third connectors and the third controller are arranged in the third cavity, the third shell comprises a plurality of third through holes, positions of the plurality of third through holes correspond to positions of the plurality of third connectors one by one, the plurality of third connectors are configured to transmit first data signals and/or first power signals; the fourth connector is arranged on a eleventh area of the third circuit board, and the eleventh area is close to the outer edge of the third circuit board, and the eleventh area is adjacent to the tenth area; the fourth connector is configured to transmit fourth data signals and/or fourth power signals;

wherein a size of the third circuit board is consistent with a size of the first circuit board, a position of the ninth area of the second circuit board corresponds to a position of the first area in the first circuit board, a position of the tenth area of the third circuit board corresponds to a position of the second area in the first circuit board, types of the plurality of third connectors are consistent with types of the plurality of first connectors, a number of the plurality of third connectors is consistent with a number of the plurality of first connectors, and a shape structure of the third shell is consistent with a shape structure of the first shell.

18. The vehicle of claim 17, wherein the plurality of the third connectors comprise at least one type of power connectors, optical fiber connectors, and Ethernet connectors, the fourth connector comprises an audio connector and/or a video connector.

* * * * *